Nov. 5, 1968 D. S. DIEHL 3,409,809
SEMICONDUCTOR WITH TRI-LAYERED METAL CONTACT
Filed April 6, 1966
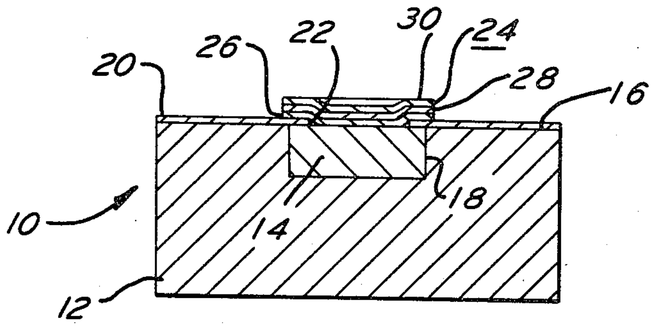
INVENTOR
DONALD S. DIEHL
BY [signature]
ATTORNEY United States Patent Office 3,409,809
Patented Nov. 5, 1968

3,409,809
SEMICONDUCTOR OR WRITE TRI-LAYERED METAL CONTACT

Donald S. Diehl, Southampton, Pa., assignor to IRC, Inc., Philadelphia, Pa.

Filed Apr. 6, 1966, Ser. No. 540,745
4 Claims. (Cl. 317—234)

ABSTRACT OF THE DISCLOSURE

The invention provides a semiconductor and an ohmic contact on its surface. The contact comprises three superposed layers of different metals in the form of coatings applied one over another.

The present invention relates to a contact for a junction type semiconductor device, and more particularly to a junction type semiconductor contact to which a terminal wire can be easily soldered.

In the manufacture of junction type semiconductor devices, it is frequently desirable to be able to solder the terminal wires to the semiconductor element. Such a soldering operation can be carried out on a mass production basis more easily and quickly and less expensively than welding or compression bonding the terminal wires to the semiconductor element. However, heretofore, to solder terminal wires to semiconductor devices has required the use of complex techniques and/or solders of exotic compositions which are relatively expensive. It is not desirable to solder directly to the semiconductor material of the semiconductor element since the solder may contaminate the semiconductor material and thereby adversely affect the electrical characteristics of the semiconductor device. Therefore, it is the general practice to coat the contact surface of the semiconductor element with a metal contact layer. The metal which can be used for the contact layer not only must not adversely contaminate the semiconductor material, but also must be capable of adhering well to the semiconductor material and providing a good ohmic contact to the semiconductor material. It has been found that only a few metals meet all these requirements, and these metals are difficult to solder to. Thus, it has been necessary to use solders of exotic compositions to solder terminal wires to these contact layers. Therefore, it is desirable to have a contact for a semiconductor to which a terminal wire can be easily soldered using less expensive, commercially available solders.

It is an object of the present invention to provide a novel contact for a junction semiconductor device.

It is another object of the present invention to provide a contact for a junction semiconductor device to which a terminal wire can be easily soldered.

It is a further object of the present invention to provide a contact for a junction semiconductor device to which a terminal wire can be easily soldered using a readily available solder.

It is still a further object of the present invention to provide a contact construction for a junction semiconductor device which can be easily soldered to and which can be easily etched to any size and shape.

Other objects will appear hereinafter.

For the purpose of illustrating the invention, there is shown in the drawings a form which is presently preferred; it being understood, however, that this invention is not limited to the precise ararngements and instrumentalities shown.

The drawing is a cross-sectional view of a junction semiconductor device having the contact of the present invention.

Referring to the drawing, the semiconductor device of the present invention is generally designated as 10. As shown, the semiconductor device 10 is a diode of planar type construction. The semiconductor device 10 comprises a flat disc 12 of a semiconductor material, such as silicon or germanium, of one conductivity type. The disc 12 may be round, square, or any desired shape. A region 14 of the opposite conductivity type is provided in one surface 16 of the disc 12. The region 14 is smaller than the disc 12 so as to provide a p-n junction 18 therebetween. A layer 20 of silicon dioxide is coated on the surface 16 of the disc 12. The silicon dioxide layer 20 has an opening 22 therein which exposes a portion of the surface of the region 14. As is well known in planar type junction semiconductor devices, the silicon dioxide layer acts as a mask during the manufacture of the semiconductor device 10 and passivates the p-n junction 18 at the surface 16 of the disc 12.

The contact of the present invention, generally designated as 24 is provided over the exposed surface of the region 14, and extends over a portion of the silicon dioxide layer 20 around the opening 22. Contact 24 comprises a bottommost thin film 26 of aluminum or chromium directly in contact with the exposed surface of the region 14, an intermediate thin film 28 of nickel or molybdenum covering the bottommost film 26, and an outer film 30 of gold covering the intermeidate film 30. The bottommost film 26 has good mechanical adhesion to the semiconductor material of the region 14 as well as good ohmic contact therewith. The outer gold film 30 can be easily soldered to with almost any desired readily available solder material. The intermediate film 28 is a diffusion barrier to prevent the gold film 20 from mixing with the bottommost film 26. If the gold film 30 was applied directly to the bottommost film 26, the gold would mix or alloy with the aluminum or chromium forming a brittle material which would have poor mechanical adhesion to the region 14 as well as a high contact resistance therewith. The intermediate film 28 prevents the gold film 30 from mixing with the bottommost film 26 yet provides a good mechanical and electrical connection between the gold film 30 and the bottommost film 26. Thus, the contact 34 of the present invention has good mechanical adhesion to the semiconductor material, a good ohmic contact with the semiconductor material, and can be easily soldered to using readily available solder materials. Since gold can be soldered to by almost any readily available standard solder composition, to solder a terminal wire to the contact 24 of the present invention, it is only necessary to choose a solder composition which is compatible with the material of the terminal wire. For example, if the silver terminal wire is to be used, a silver element solder can be used. If a copper terminal wire is used, a standard tin-lead solder can be used.

The semiconductor device of the present invention can be made using any of the well-known techniques for forming junction type semiconductor devices. To make the planar type diode 10 shown in the drawing and described above, it is the general practice to start with a flat wafer of the semiconductor material of one conductivity type, such as p-type silicon. The wafer is many times larger in surface area than the individual diode 10 so that a plurality of the diodes can be made simultaneously. At least one surface of the wafer is coated with the layer 20 of silicon dioxide. The silicon dioxide layer 20 can be formed by heating the wafer in an atmosphere containing oxygen and/or vapor to oxidize the surface of the wafer.

The silicon dioxide layer 20 on the wafer is then provided with a plurality of openings therethrough. The number of the openings provided depends on the number of diodes 10 to be made, one opening for each diode, and the size of each of the openings corresponds to the area of the region 14 to be formed. The openings are formed by applying a coating of a suitable resist material over the entire surface of the silicon dioxide layer 20 except the areas where the openings are to be provided. The exposed areas of the silicon dioxides layer 20 are then removed by a suitable etching material, such as a mixture of ammonium flouride, hydrofluoric acid and water, so as to provide the openings 22. This exposes areas of the surface of the wafer.

The regions 14 of a conductivity type opposite to that of the wafer are then formed in the wafer. If the wafer is of p-type conductivity, a donor material of high concentration n-type, such as phosphorous oxide, is coated on the exposed surface of the wafer, and the wafer is heated to diffuse the n-type donor material into the wafer to form the p-n junction 18. If the wafer is of n-type conductivity, a p-type donor material, such as boron oxide, is coated on the exposed surface of the wafer, and the wafer is heated to diffuse the p-type donor material into the wafer to form the p-n junctions 18. The diffusion process is carried out in an atmosphere containing oxygen and/or water vapors to oxidize the exposed surfaces of the regions 14. This extends the silicon dioxide layer 20 over the surface of the regions 14. The contact receiving openings 22 are then formed in the silicon dioxide layer 22 over a portion of the regions 14. The contact receiving openings 22 are formed by removing portions of the silicon dioxide layer 20 in the manner previously described.

The contacts 24 of the present invention are then applied to the wafer. This is preferably carried out by the well-known technique of evaporation of metals in a vacuum. For this process, the wafer is mounted in a sealed chamber which is evacuated to a low pressure, approximately $10^{-6}$ millimeters of mercury. Within the chamber are three tungsten heaters, each containing one of the three metals of the contact. The wafer is mounted with the surface on which the contacts are to be formed facing the heaters. Also in the chamber is a heater mounted adjacent the wafer to heat the wafer. When the chamber is evacuated to the appropriate pressure, the electrical current is passed through the heater containing either the aluminum or chromium to heat the metal to its evaporation temperature. The metal vapors diffuse toward the wafer and condense on the silicon dioxide layer 20 and the exposed areas of the regions 14 to form the bottommost film 26 of the contacts 24. When a bottommost film 26 of the desired thickness is obtained, the current to the aluminum or chromium heater is turned off to discontinue the evaporation of the metal. An electrical current is then passed through the heater containing the nickel or molybdenum to evaporate the metal and thereby form the intermediate film 28 of the contact 24 over the bottommost film 26. After the nickel or molybdenum evaporation is discontinued, an electrical current is passed through the heater containing the gold to evaporate the gold and deposit the gold film 30 over the intermediate film 28. During the formation of the three metal films 26, 38 and 30, it has been found desirable to heat the wafer to achieve good adhesion of the metal films to the wafer. The wafer is heated to approximately 150° C. during the deposition of the aluminum or chromium film 26, and to approximately 300° C. during the deposition of the nickel or molybdenum and gold films.

At this point, the films of the contacts 24 extend across the entire surface of the wafer. However, for various reasons including ease of dividing the wafer into the individual diode elements, it is desirable to reduce the size of each of the contacts 24 so that they extend only slightly beyond the edge of the openings 22 in the silicon dioxide layer 20. This can be achieved by applying a suitable resist material over the areas of the contact films which are to be retained, and then removing the exposed area by means of suitable etching materials. For example, the exposed area of the outermost gold film can be removed with a cyanide-based gold stripping solution, such as a cyanide solution of Technistrip AU manufactured by Technic, Inc., of Providence, R.I. The excess area of a nickel intermediate film can be then removed by a 10% solution of nitric acid in deionized water. The excess area of a molybdenum intermedate film can be removed by the well-known technique of electrolytic deplating. The excess area of the bottommost aluminum film can then be removed by a 10% solution of sodium hydroxide deionized water. The excess area of a bottommost chromium film can be removed by dilute hydrochloric acid.

The wafer is now divided into the individual diode elements 10. This can be achieved either by cutting the wafer along lines between the regions 14 with a saw, or by using the scratch and break technique. A terminal wire can then be soldered to the contact 24 using any standard soldering technique. For example, a layer of the solder can be coated over the contact 24, the terminal wire placed against the solder layer, and the assembly is heated to bond the terminal wire to the solder. Coating the contact with the solder can also be carried out prior to to dividing the wafer into the individual semiconductor devices by dipping the surface of the wafer into molten solder so as to simultaneously coat all of the contacts with the solder. The terminal wires can then be bonded to each of the solder coated contacts after the wafer is divided into the individual semi-conductor devices. Another method which can be used is to place a solder preform on the contact 24, place a terminal wire against the solder preform, and then heat the assembly to melt the solder and bond the terminal wire to the contact.

Although the contact of the present invention is shown and described as being used on a junction type diode having a single p-n junction, it should be understood that the contact can be used on junction type semiconductor devices having multiple p-n junctions, such as transistors, integrated circuits and the like. Also, although the contact of the present invention has particular utility of junction type semi-conductor devices of the planar construction, it should be understood that this contact can be used on junction type semiconductor devices made by other well-known techniques.

The present invention may be embodied in other specific forms without department from the spirit or essential attributes thereof and, accordingly, reference should be made to the appended claims, rather than to the forgoing specification as indicating the scope of the invention.

I claim:

1. A semiconductor device comprising a disk of a semiconductor material having a p-n junction therein, a contact on said disk at one side of said p-n junction to which a terminal wire can be soldered, said contact comprising a bottommost film of a metal selected from the group consisting of aluminum and chromium in direct contact with said disk, an intermediate film of a metal selected from the group consisting of nickel and molybdenum covering said bottommost film, and a film of gold covering said intermediate film.

2. A semiconductor device in accordance with claim 1 and the disk has in one surface thereof a region of a conductivity type opposite to the conductivity type of the disk adjacent said region so as to provide the p-n junction, and the contact extends over at least a portion of said region.

3. A semiconductor device in accordance with claim 2 including a layer of silicon dioxide extending over said one surface of the disk, said silicon dioxide layer having an opening therethrough exposing a portion of said region, and the contact extends over said region within said opening.

4. A semiconductor device in accordance with claim 3 in which the contact extends over at least a portion of said silicon dioxide layer around the openings.

References Cited

UNITED STATES PATENTS

| | | | |
|---|---|---|---|
| 3,290,753 | 12/1966 | Chang | 317—234.5 |
| 3,233,309 | 2/1966 | Emeis | 317—234.5 |
| 3,169,304 | 2/1965 | Gould | 317—234.5 |

JAMES D. KALLAM, *Primary Examiner.*

UNITED STATES PATENT OFFICE
CERTIFICATE OF CORRECTION

Patent No. 3,409,809 November 5, 1968

Donald S. Diehl

It is certified that error appears in the above identified patent and that said Letters Patent are hereby corrected as shown below:

In the heading to the printed specification, title of invention, line 2, "OR WRITE" should read -- WITH --; line 5, IRC, Inc., Philadelphia, Pa." should read -- TRW Inc., a corporation of Ohio --.

Signed and sealed this 3rd day of March 1970.

(SEAL)
Attest:

Edward M. Fletcher, Jr.
Attesting Officer

WILLIAM E. SCHUYLER, JR.
Commissioner of Patents